US009184743B2

(12) United States Patent
Shimizu (10) Patent No.: US 9,184,743 B2
(45) Date of Patent: Nov. 10, 2015

(54) CONTROL APPARATUS FOR SWITCHING DEVICE

(75) Inventor: Naoki Shimizu, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 199 days.

(21) Appl. No.: 13/612,664

(22) Filed: Sep. 12, 2012

(65) Prior Publication Data

US 2013/0094114 A1 Apr. 18, 2013

(30) Foreign Application Priority Data

Oct. 18, 2011 (JP) .................................. 2011-228900

(51) Int. Cl.
*H02H 3/08* (2006.01)
*H03K 17/567* (2006.01)
*H03K 17/082* (2006.01)

(52) U.S. Cl.
CPC ............ *H03K 17/567* (2013.01); *H03K 17/082* (2013.01)

(58) Field of Classification Search
CPC .............. H03K 17/082; H03K 17/567; H03K 17/0822; H03K 17/0824; H03K 17/0826; H03K 17/0828; H02H 3/08; H02H 3/085; H02H 3/087; H02H 3/093; H02H 3/10; H02H 3/26
USPC .................................................. 361/87, 93.1
See application file for complete search history.

(56) References Cited

U.S. PATENT DOCUMENTS

| 5,710,508 | A  | * | 1/1998  | Watanabe      | 323/284  |
|-----------|----|---|---------|---------------|----------|
| 6,717,785 | B2 | * | 4/2004  | Fukuda et al. | 361/93.1 |
| 2001/0026429 | A1 |   | 10/2001 | Fukuda et al. |          |
| 2012/0075761 | A1 | * | 3/2012  | Miura et al.  | 361/93.1 |

FOREIGN PATENT DOCUMENTS

| EP | 1 881 587 A1 | 1/2008 |
| JP | 3040517 A | 2/1991 |
| JP | 2003134797 A | 5/2003 |
| JP | 2007-312504 A | 11/2007 |

(Continued)

OTHER PUBLICATIONS

European Search Report (EP Appl. No. 12 18 4065) issued on Sep. 11, 2014.

(Continued)

*Primary Examiner* — Thienvu Tran
*Assistant Examiner* — Kevin J Comber
(74) *Attorney, Agent, or Firm* — Rabin & Berdo, P.C.

(57) ABSTRACT

A control apparatus for a switching device which suppresses surge voltages at the time of current shutoff of a switching device to protect from overcurrents although the switching device is not in an overcurrent state, including a current sensor, a comparator, a timer latch, a control circuit, and a transistor. The current sensor detects the current of a switching device and outputs a detected voltage. The comparator outputs a signal when the detected voltage is equal to or greater than a reference voltage. When the time duration of the output signal is equal to or greater than a setting time, the timer latch outputs a surge suppression detection signal, based on which the control circuit outputs to the transistor a driving signal to turn off the switching device. The reference voltage is smaller than a reference voltage used when detecting an overcurrent flowing in the switching device.

15 Claims, 6 Drawing Sheets

(56) References Cited

FOREIGN PATENT DOCUMENTS

| JP | 2008141841 A | 6/2008 |
|----|--------------|--------|
| JP | 2009-060358 A | 3/2009 |
| JP | 2010-034746 A | 2/2010 |
| JP | 2010136568 A | 6/2010 |
| JP | 2010-283973 A | 12/2010 |

OTHER PUBLICATIONS

European Search Report (EP Appl. No. 12 18 4061) issued on Sep. 11, 2014.

* cited by examiner

CONTROL APPARATUS FOR SWITCHING DEVICE

CROSS-REFERENCE TO RELATED APPLICATION

This application is based on, and claims priority to, Japanese Patent Application No. 2011-228900, filed on Oct. 18, 2011, contents of which are incorporated herein by reference.

BACKGROUND OF THE INVENTION

1. Field of the Invention

This invention relates to a control apparatus for a voltage controlled-type switching device such as an insulated gate bipolar transistor (IGBT), to control conduction and shutoff of the switching device.

2. Description of the Related Art

As one type of control apparatus, for example the apparatus disclosed in Japanese Patent Application Laid-open No. 2008-141841 is known.

This apparatus of the prior art comprises a driving circuit which causes conduction and shutoff of the switching device, and a current sensor which detects the current flowing in the switching device.

Further, the apparatus of the prior art comprises a first comparison circuit which compares the current detected by a current sensor with a first reference value, and when the detected current is equal to or greater than the first reference value, outputs an overcurrent detection signal indicating an overcurrent in the switching device.

Further, the apparatus of the prior art comprises a second comparison circuit which compares the current detected by the current sensor with a second reference value, and when this detected current is equal to or greater than the second reference value, outputs a pass-through current detection signal indicating a current passing through the switching device.

Further, the apparatus of the prior art shuts off the switching device when the time duration of an overcurrent detection signal output from the first comparison circuit is equal to or greater than a first regulation time, or when the time duration of a pass-through current detection signal output from the second comparison circuit is equal to or greater than a second regulation time.

In an apparatus of the prior art comprising such a configuration, when there is an overcurrent or a pass-through current in the switching device, by shutting off the switching device, surge voltage occurring at the time of current shutoff of the switching device can be suppressed.

However, such an apparatus of the prior art has the problem that, when the switching device is not in an overcurrent state, but suppression of surge voltages at the time of current shutoff of the switching device is necessary for the purpose of protection from overcurrents, such surge voltage suppression is not possible.

SUMMARY OF THE INVENTION

Hence focusing on the above problem, an object of this invention is to provide a control apparatus for a switching device such that, when the switching device is not in an overcurrent state, but suppression of surge voltages at the time of current shutoff of the switching device is necessary for the purpose of protection from overcurrents, such surge voltages can be suppressed.

In order to attain the above object, this invention employs the following configuration.

That is, a first embodiment of the invention is a control apparatus for a switching device, which controls conduction and shutoff of the switching device, comprising a current sensor which detects a current flowing in the switching device; a first comparison circuit which compares a detected current of the current sensor with a first reference value determined in advance, and when the detected current is equal to or greater than the first reference value, outputs a surge suppression signal; and a first shutoff circuit which shuts off the switching device when the surge suppression signal is output from the first comparison circuit, wherein the first reference value is set to be smaller than a second reference value which is determined in advance to detect an overcurrent flowing in the switching device.

In the first embodiment of the invention, the first reference value is set between a rated current value of the switching device and the second reference value.

In the first embodiment of the invention, the control apparatus further comprises a second comparison circuit which compares the detected current of the current sensor with the second reference value, and when the detected current is equal to or greater than the second reference value, outputs an overcurrent detection signal; and a second shutoff circuit which shuts off the switching device when the surge suppression signal is output from the first comparison circuit and the overcurrent detection signal is output from the second comparison circuit.

A second embodiment of the invention is a control apparatus for a switching device, which controls conduction and shutoff of the switching device, comprising a current sensor which detects a current flowing in the switching device; a comparison circuit which compares a detected current of the current sensor with a reference value determined in advance, and when the detected current is equal to or greater than the reference value, outputs a detection signal; a first signal generation circuit which outputs a surge suppression signal when a time duration of the detection signal output from the comparison circuit is equal to or greater than a first setting time; and a first shutoff circuit which shuts off the switching device when the surge suppression signal is output from the first signal generation circuit, wherein the first setting time is set to be short compared with a second setting time which is determined in advance to detect an overcurrent flowing in the switching device.

In the second embodiment of the invention, the control apparatus further comprises a second signal generation circuit which outputs an overcurrent detection signal when the time duration of the detection signal output from the comparison circuit is equal to or greater than the second setting time; and a second shutoff circuit which shuts off the switching device when the surge suppression signal is output from the first signal generation circuit, and the overcurrent detection signal is output from the second signal generation circuit.

By means of this invention, when the switching device is not in an overcurrent state, but suppression of surge voltages at the time of current shutoff of the switching device is necessary for the purpose of protection from overcurrents, such surge voltages can be suppressed.

Further, in this invention, when a shutoff capability of the first shutoff circuit is set to be greater than a shutoff capability of the second shutoff circuit, the power consumption during shutoff of the first shutoff circuit can be alleviated compared with the power consumption during shutoff of the second shutoff circuit.

DESCRIPTION OF THE PREFERRED EMBODIMENTS

Below, embodiments of the invention are explained based on the drawings.

(Summary of the First Embodiment)

A first embodiment of a control apparatus for a switching device of this invention is applied to an intelligent power module (IPM) used in an inverter driving a motor and similar applications.

Figure 1:
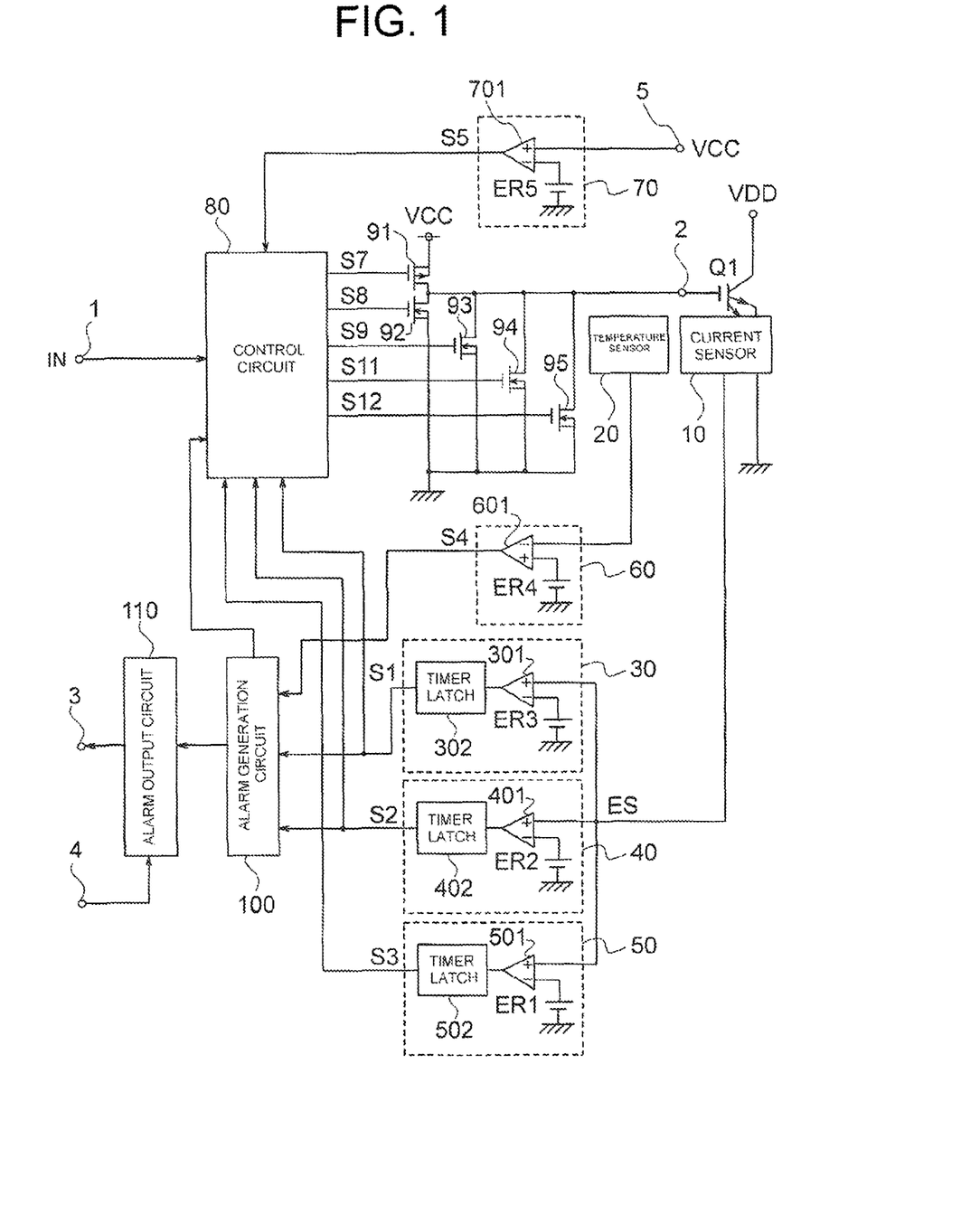
FIG. 1 shows the configuration of a first embodiment of a control apparatus for a switching device of this invention.

As shown in FIG. 1, this control apparatus comprises an input terminal 1, output terminal 2, alarm output terminal 3, reset terminal 4, and power supply voltage terminal 5, and controls conduction and shutoff of the switching device Q1 connected to the output terminal 2. This control apparatus operates by means of a power supply voltage VCC supplied to the power supply voltage terminal 5.

The switching device Q1 comprises an IGBT or similar, with a rated current of for example several tens to several hundreds of amperes (A). When this control apparatus is applied to an inverter, the switching device Q1 is a portion of the inverter constituent elements.

(Configuration of the First Embodiment)

Next, the configuration of the control apparatus of the first embodiment is explained, referring to FIG. 1.

As shown in FIG. 1, this control apparatus comprises a current sensor 10, temperature sensor 20, pass-through current detection circuit 30, overcurrent detection circuit 40, surge suppression detection circuit 50, overheating detection circuit 60, potential drop detection circuit 70, control circuit 80, a plurality of transistors 91 to 95, alarm generation circuit 100, and alarm output circuit 110.

The current sensor 10 detects current flowing in the switching device Q1, generates a detection voltage ES according to this detected current, and outputs this generated detection voltage ES to each of the pass-through current detection circuit 30, the overcurrent detection circuit 40, and the surge suppression detection circuit 50.

The temperature sensor 20 detects the temperature of the switching device Q1, and outputs a detection voltage according to this detected temperature to the overheating detection circuit 60.

The pass-through current detection circuit 30 detects the current passing through the switching device Q1 (pass-through current) based on the current detected by the current sensor 10, and when a pass-through current has been detected, outputs a pass-through current detection signal S1 to both the control circuit 80 and the alarm generation circuit 100.

For this purpose, the pass-through current detection circuit 30 comprises a comparator 301 and a timer latch 302. The comparator 301 compares the detected voltage ES of the current sensor 10 with a reference voltage ER3, and when the detected voltage ES is equal to or greater than the reference voltage ER3, outputs a high level signal. The timer latch 302 counts the time duration of the output signal when the high level signal is output from the comparator 301, and when the counted time is equal to or greater than a setting time T1, outputs the pass-through current detection signal S1 to both the control circuit 80 and to the alarm generation circuit 100.

The overcurrent detection circuit 40 detects an overcurrent in the switching device Q1 based on the detected current of the current sensor 10, and when an overcurrent is detected, outputs an overcurrent detection signal S2 to both the control circuit 80 and to the alarm generation circuit 100.

For this purpose, the overcurrent detection circuit 40 comprises a comparator 401 and a timer latch 402. The comparator 401 compares the detected voltage ES of the current sensor 10 with a reference voltage ER2, and when the detected voltage ES is equal to or greater than the reference voltage ER2, outputs a high level signal. The timer latch 402 counts the time duration of this output signal when the high level signal is output from the comparator 401, and when the counted time is equal to or greater than a setting time T2, outputs an overcurrent detection signal S2 to both the control circuit 80 and to the alarm generation circuit 100.

The surge suppression detection circuit 50 outputs a surge suppression detection signal S3 to the control circuit 80 when it is determined, on the basis of the current detected by the current sensor 10, that suppression of the surge voltage occurring at the time of current shutoff of the switching device Q1 is necessary.

For this purpose, the surge suppression detection circuit 50 comprises a comparator 501 and a timer latch 502. The comparator 501 compares the detected voltage ES of the current sensor 10 with a reference voltage ER1, and when the detected voltage ES is equal to or greater than the reference voltage ER1, outputs a high level signal. The timer latch 502 counts the time duration of this output signal when the high level signal is output from the comparator 501, and when the counted time is equal to or greater than the setting time T2, outputs the surge suppression detection signal S3 to the control circuit 80.

Here the reference voltages ER3, ER2, and ER1 respectively set in the above-described comparators 301, 401, and 501 are determined in advance. The reference voltages ER3, ER2, and ER1 are set so as to satisfy the relation of the following equation (1).

$$ER3 > ER2 > ER1 \tag{1}$$

Further, if the voltage determined in advance corresponding to the rated current of the switching device Q1 is ERC, then it is preferable that the reference voltage ER1 used by the comparator 501 satisfy the relation of the following equation (2).

$$ER2 > ER1 > ERC \tag{2}$$

Here, when the switching device Q1 is an IGBT, if for example the rated current of the IGBT is 300 A, the current for overcurrent protection is approximately 450 A. Hence based on these values, the reference voltages ER2, ER1 and ERC are each set.

Further, the setting time T1 of the timer latch 302 is set to be short compared with the setting time T2 of the timer latches 402 and 502. The setting time T1 of the timer latch 302 is for example 2 μs, and the setting time T2 of the timer latches 402 and 502 is for example 4 μs.

The overheating detection circuit 60 detects whether the switching device Q1 connected to the output terminal 2 is in an overheated state, and when an overheated state is detected, outputs an overheating detection signal S4 to the alarm generation circuit 100. For this purpose, the overheating detection circuit 60 comprises a comparator 601. The comparator 601 compares the detected voltage of the temperature sensor 20 with a reference voltage ER4, and when the detected voltage is equal to or greater than the reference voltage ER4, outputs the overheating detection signal S4 to the alarm generation circuit 100.

The potential drop detection circuit 70 detects the power supply voltage VCC supplied to the power supply voltage terminal 5, and when this detected voltage is equal to or below a prescribed value, outputs a potential drop signal S5 to the control circuit 80. For this purpose, the potential drop detection circuit 70 comprises a comparator 701. The comparator 701 compares the power supply voltage VCC with a reference voltage ER5, and when the detected voltage is equal to or less than the reference voltage ER5, outputs the potential drop signal S5 to the control circuit 80.

Each of the plurality of transistors 91 to 95 operates by means of driving signals s7, s8, s9, s11 and s12 respectively output from the control circuit 80, and have the following functions. The output terminals of the plurality of transistors 91 to 95 are connected in common to the output terminal 2.

The transistor 91 comprises a P type MOS transistor, and functions as a turn-on transistor used when turning on normal switching of the switching device Q1 connected to the output terminal 2.

The transistor 92 comprises an N type MOS transistor, and functions as a turn-off transistor used when turning off normal switching of the switching device Q1.

The transistor 93 is a transistor for turn-off protection, used to reduce the output impedance in order to prevent erroneous operation during normal switching-on of the switching device Q1. This transistor 93 comprises an N type MOS transistor.

The transistor 94 protects the switching device Q1 from pass-through currents and overcurrents, and functions as a transistor for soft shutoff which gradually lowers the gate potential of the switching device Q1 during current shutoff of the switching device Q1.

The transistor 95 functions as a transistor for soft shutoff which gradually lowers the gate potential of the switching device Q1 during shutoff to suppress surge voltages during current shutoff of the switching device Q1, even though the switching device Q1 is not in an overcurrent state.

Here the transistors 94 and 95 function as transistors for soft shutoff, as explained above, but their shutoff capabilities (driving capabilities) are set as explained below.

The shutoff capability of the transistor 95 is set to be large relative to the shutoff capability of the transistor 94. Specifically, the transistor size of the transistor 95 is set to be large compared with the transistor size of the transistor 94.

The control circuit 80 outputs a driving signal S7 to turn the switching device Q1 on and a driving signal S8 to turn the switching device Q1 off, based on an input signal IN supplied to the input terminal 1.

Hence when turning on the switching device Q1, only the transistor 91 is turned on by the driving signal S7, the power supply voltage VCC is applied to the gate of the switching device Q1, and the gate is charged. When turning off the switching device Q1, the turn-off transistor 92 is turned on by the driving signal S8, the gate of the switching device Q1 is connected to ground, and the charge on the gate is discharged.

The control circuit 80 outputs the driving signal S9 when the switching device Q1 is turned off for protection, based on the potential drop signal S5 output from the potential drop detection circuit 70. By this means the driving signal S9 turns on the transistor for turn-off protection 93, the gate of the switching device Q1 is connected to ground, and the switching device Q1 is protected.

Further, when the pass-through current detection signal S1 is output from the pass-through current detection circuit 30, the control circuit 80 generates a driving signal S11 to turn off the switching device Q1, and outputs the signal to the transistor 94. As a result the driving signal S11 turns on the transistor for soft shutoff 94, the gate of the switching device Q1 is connected to ground, and the gate charge is gradually discharged.

Further, when only the surge suppression detection signal S3 is output from the surge suppression detection circuit 50, the control circuit 80 generates a driving signal S12 to turn off the switching device Q1, and outputs the signal to the transistor 95. As a result the driving signal S12 turns on the transistor for soft shutoff 95, the gate of the switching device Q1 is connected to ground, and the gate charge is gradually discharged.

Further, when the surge suppression detection signal S3 is output from the surge suppression detection circuit 50 and the overcurrent detection signal S2 is output from the overcurrent detection circuit 40, the control circuit 80 generates the driving signal S11 to turn off the switching device Q1, and outputs the signal to the transistor 94. As a result the driving signal S11 turns on the transistor for soft shutoff 94, the gate of the switching device Q1 is connected to ground, and the gate charge is gradually discharged.

When the pass-through current detection signal S1 is output from the pass-through current detection circuit 30, or the overcurrent detection signal S2 is output from the overcurrent detection circuit 40, or the overheating detection signal S4 is output from the overheating detection circuit 60, the alarm generation circuit 100 generates an alarm signal, and outputs the signal to the alarm transmission circuit 110. When an alarm signal is generated and output, the alarm generation circuit 100 notifies the control circuit 80 of this fact.

When an alarm signal is output from the alarm generation circuit 100, the alarm output circuit 110 outputs the alarm signal to an external device via the alarm output terminal 3. Output of the alarm signal output from the alarm output circuit 110 can be stopped by a reset signal input to the reset terminal 4.

(Operation of the First Embodiment)

Next, operation of the first embodiment is explained, referring to the drawings.

In this operation example, it is assumed that in the first embodiment the gate of the switching device Q1 is connected to the output terminal 2, the power supply voltage VDD is applied to the collector of the switching device Q1, and the emitter of the switching device Q1 is grounded.

(First Operation Example)

Figure 2:
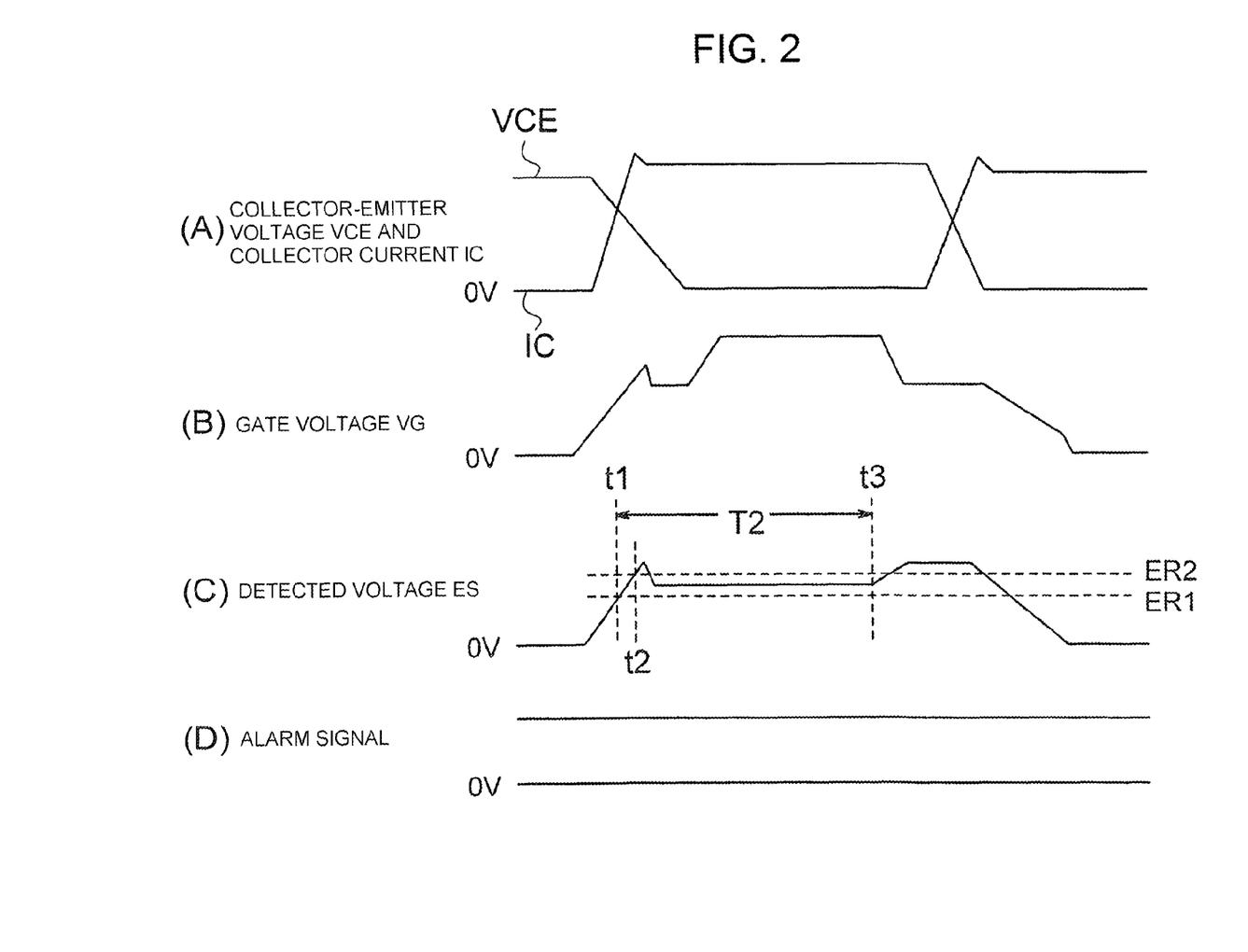
FIG. 2 is a waveform diagram of various portions, explaining a first operation example of the first embodiment.

A first operation example is explained referring to FIG. 1 and FIG. 2.

The control circuit 80 generates and outputs driving signals S7 and S8 based on the input signal IN input to the input terminal 1. For this reason, when the driving signal S7 is output from the control circuit 80, the transistor 91 operates as a result and the switching device Q1 is turned on. Further, when the driving signal S8 is output from the control circuit 80, the transistor 92 operates as a result and the switching device Q1 is turned off.

Through this operation, at or before time t1 shown in FIG. 2, the gate voltage VG of the switching device Q1 is as shown in (B) of FIG. 2. Further, the collector-emitter voltage VCE of the switching device Q1 and the collector current IC of the MOS transistor Q1 are as shown in (A) of FIG. 2. And, the detected voltage ES output from the current sensor 10 is as shown in (C) of FIG. 2.

As shown in (C) of FIG. 2, when at time t1 the detected voltage ES of the current sensor 10 becomes equal to or greater than the reference voltage ER1 of the comparator 501, the comparator 501 outputs a high level signal to the timer latch 502. The timer latch 502 counts the time duration of the output signal from the comparator 501, and when at time t3 the counted time becomes equal to or greater than the setting time T2, outputs the surge suppression detection signal S3 to the control circuit 80.

On the other hand, as shown in (C) of FIG. 2, when at time t2 the detected voltage ES of the current sensor 10 becomes equal to or greater than the reference voltage ER2 of the comparator 401, the comparator 401 outputs a high level signal to the timer latch 402. However, the output signal of the comparator 401 does not become equal to or greater than the setting time T2 of the timer latch 402, and so an overcurrent detection signal S2 is not output from the timer latch 402. Consequently an overcurrent detection signal S2 is not output from the timer latch 402 to the alarm generation circuit 100, and thus an alarm signal is not output from the alarm output circuit 110 (see (D) of FIG. 2).

In this way, when only the surge suppression detection signal S3 is output from the timer latch 502 to the control circuit 80, the control circuit 80 generates the driving signal S12 based on this surge suppression detection signal S3 and outputs this driving signal S12 to the transistor 95. By this means the transistor 95 is turned on, the gate of the switching device Q1 is connected to ground, and the gate charge is gradually discharged. Hence when the switching device Q1 is not in an overcurrent state, but suppression of surge voltages at the time of current shutoff of the switching device Q1 is necessary for the purpose of protection from overcurrents, such surge voltages can be suppressed.

(Second Operation Example)

Figure 3:
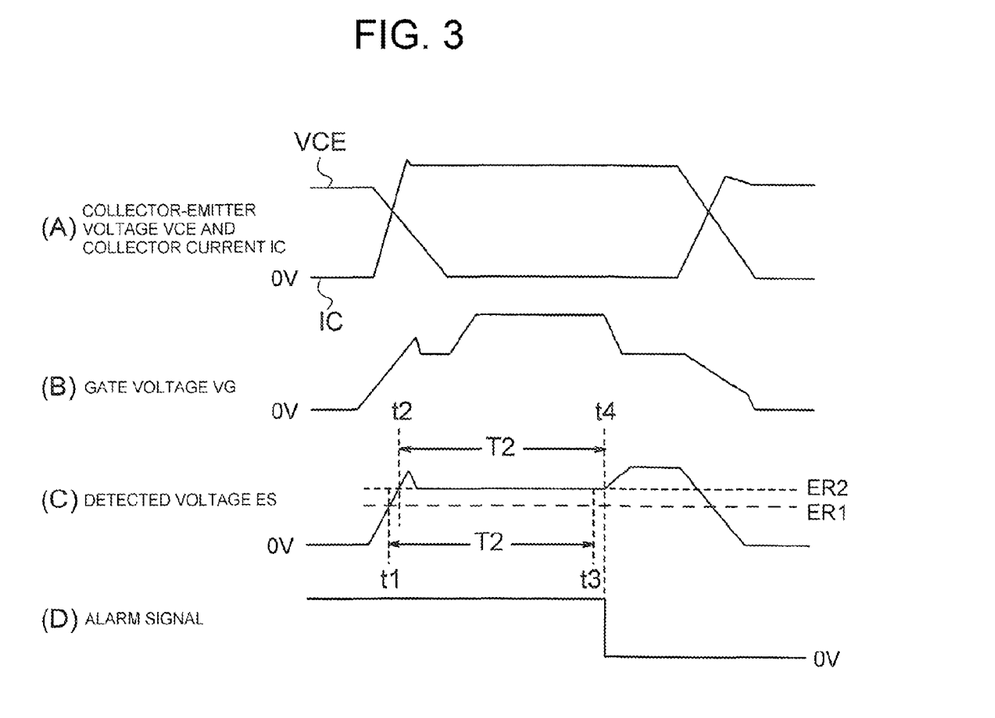
FIG. 3 is a waveform diagram of various portions, explaining a second operation example of the first embodiment.

A second operation example is explained referring to FIG. 1 and FIG. 3.

As shown in (C) of FIG. 3, when at time t1 the detected voltage ES of the current sensor 10 becomes equal to or greater than the reference voltage ER1 of the comparator 501, the comparator 501 outputs a high level signal to the timer latch 502. The timer latch 502 counts the time duration of the output signal from the comparator 501, and when at time t3 the counted time becomes equal to or greater than the setting time T2, outputs the surge suppression detection signal S3 to the control circuit 80.

On the other hand, when at time t2 the detected voltage ES of the current sensor 10 becomes equal to or greater than the reference voltage ER2 of the comparator 401, the comparator 401 outputs a high level signal to the timer latch 402. The timer latch 402 counts the time duration of the output signal from the comparator 401, and when at time t4 the counted time becomes equal to or greater than the setting time T2, outputs the overcurrent detection signal S2 to the control circuit 80 and to the alarm generation circuit 100. The alarm generation circuit 100 generates and outputs an alarm signal, as shown in (D) of FIG. 3.

When in this way the surge suppression detection signal S3 and the overcurrent detection signal S2 are output to the control circuit 80 from the timer latch 502 and the timer latch 402 respectively, the control circuit 80 generates the driving signal S11 based on the two signals S2 and S3, and outputs this driving signal S11 to the transistor 94. By this means the transistor 94 is turned on, the gate of the switching device Q1 is connected to ground, and the gate charge is gradually discharged. Hence surge voltages due to overcurrents at the time of current shutoff of the switching device Q1 are suppressed.

(Advantageous Effects of the First Embodiment)

As explained above, by means of the first embodiment, when the switching device Q1 is not in an overcurrent state but suppression of surge voltages at the time of current shutoff of the switching device Q1 is necessary for the purpose of protection from overcurrents, such surge voltages can be effectively suppressed, as in the first operation example.

Further, as described above in the first embodiment, the shutoff capability for soft shutoff of the switching device Q1 by the transistor 95 is made larger than the shutoff capability of the transistor 94.

Hence in order to provide protection from overcurrents, changes in the collector-emitter voltage VCE and the collector current IC of the switching device Q1 when the transistor 94 performs a soft shutoff of the switching device Q1 are as shown in (A) of FIG. 3. On the other hand, in order to suppress surge voltages, changes in the collector-emitter voltage VCE and the collector current IC of the switching device Q1 when the transistor 95 performs a soft shutoff of the switching device Q1 are as shown in (A) of FIG. 2, and the slopes of these changes are large compared with (A) of FIG. 3.

Hence by means of the first embodiment, when the transistor 95 performs a soft shutoff of the switching device Q1, compared with the case in which the transistor 94 performs a soft shutoff of the switching device Q1 during the occurrence of an overcurrent in the switching device Q1, power consumption during shutoff can be reduced.

(Modified Examples of the First Embodiment)

(1) First Modified Example

The comparator 501 of the surge suppression detection circuit 50 in FIG. 1 may be replaced with a window comparator.

When replaced with a window comparator, there are two reference voltages. Hence one of the reference voltages is set to the reference voltage ER2 of the comparator 401, and the other reference voltage is set to the reference voltage ERC determined in advance and corresponding to the rated current of the switching device Q1. The reference voltages ER2 and ERC satisfy the relationship ER2 >ERC.

Through these settings, when the detected voltage ES of the current sensor 10 is between the reference voltage ER2 and the reference voltage ERC, the window comparator can output a high level signal. Based on this output signal, the timer latch 502 can output the surge suppression detection signal S3.

(2) Second Modified Example

In addition to the transistors 94 and 95 in FIG. 1, a first resistance may be connected in series with the transistor 94, and a second resistance may be connected in series with the transistor 95.

In this case also, the shutoff capability of the transistor 95 is made larger than the shutoff capability of the transistor 94; to this end, the following two methods may be used.

In the first method, the transistors 94 and 95 are made the same transistor size, and the resistance value of the first resistance is made large compared with the resistance value of the second resistance.

In the second method, the resistance values of the first and second resistances are made equal, and the size of the transistor 95 is made large compared with the size of the transistor 94.

(Configuration of a Second Embodiment)

Figure 4:
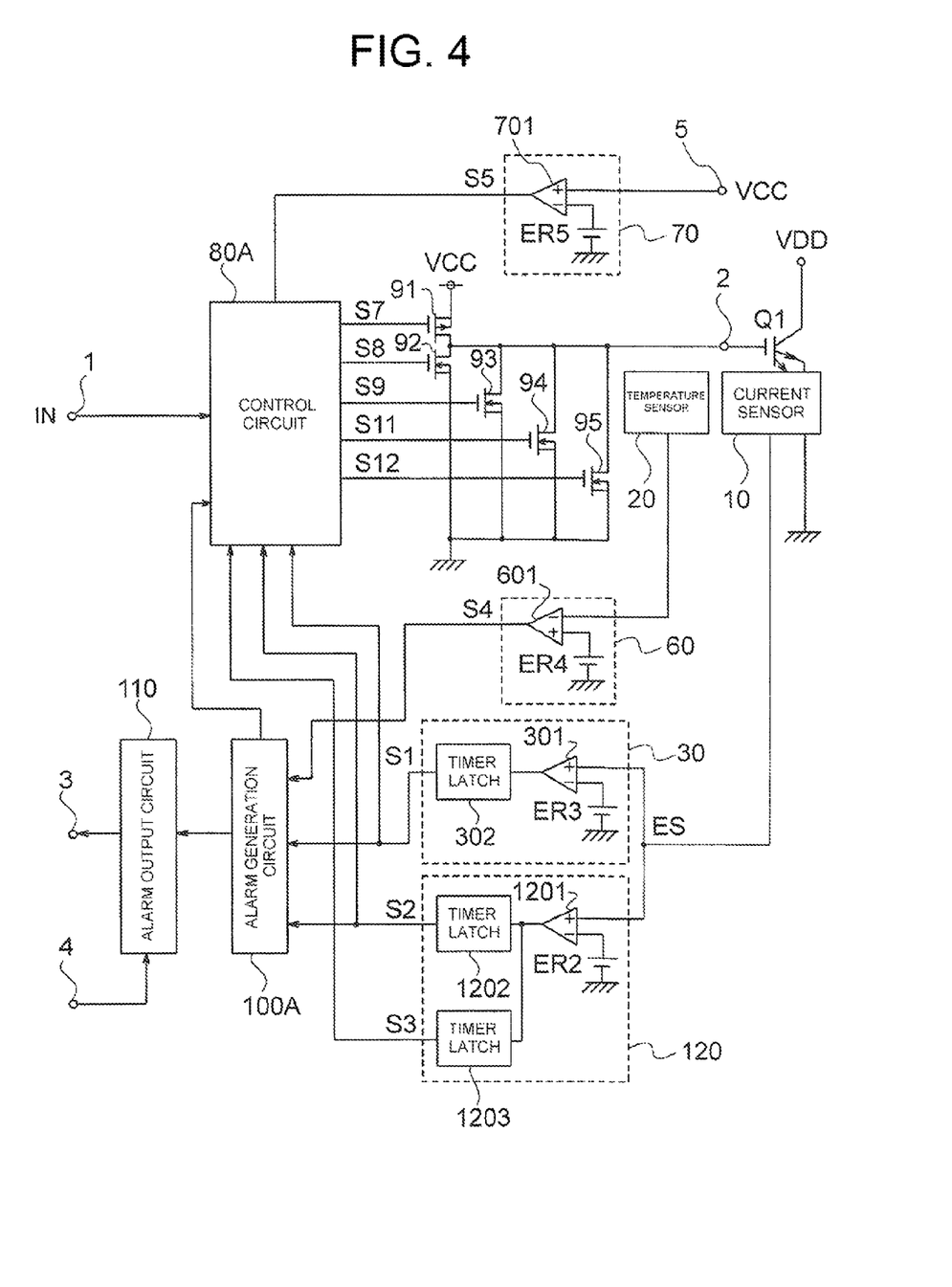
FIG. 4 shows the configuration of a second embodiment of a control apparatus for a switching device of this invention.

Next, the configuration of the control apparatus in a second embodiment is explained referring to FIG. 4.

As shown in FIG. 4, this control apparatus comprises a current sensor 10, temperature sensor 20, pass-through current detection circuit 30, current detection circuit 120, overheating detection circuit 60, potential drop detection circuit 70, control circuit 80A, a plurality of transistors 91 to 95, alarm generation circuit 100A, and alarm output circuit 110.

The control apparatus of the second embodiment is based on the configuration of the control apparatus shown in FIG. 1, with the overcurrent detection circuit 40 and surge suppression detection circuit 50 shown in FIG. 1 replaced with the current detection circuit 120 shown in FIG. 4, and moreover with the control circuit 80 and alarm generation circuit 100 shown in FIG. 1 replaced with the control circuit 80A and alarm generation circuit 100A shown in FIG. 4.

Consequently, in the second embodiment, constituent elements which are the same as in the first embodiment are assigned the same symbols, and explanations thereof are omitted to the extent possible.

The current detection circuit 120 detects overcurrents in the switching device Q1 based on the detected current of the current sensor 10, and when an overcurrent is detected, outputs an overcurrent detection signal S2 to both the control circuit 80A and to the alarm generation circuit 100A.

The current detection circuit 120, upon determining based on the detected current of the current sensor 10 that although the switching device Q1 is not in an overcurrent state, it is necessary to suppress surge voltages occurring during shutoff of the switching device Q1, outputs a surge suppression detection signal S3 to the control circuit 80.

For this purpose, as shown in FIG. 4, the current detection circuit 120 comprises a comparator 1201, timer latch 1202, and timer latch 1203.

The comparator 1201 compares the detected voltage ES of the current sensor 10 with the reference voltage ER2, and when the detected voltage ES is equal to or greater than the reference voltage ER2, outputs a high level signal.

When a high level signal is output from the comparator 1201, the timer latch 1202 counts the time duration of the output signal, and when the counted time becomes equal to or greater than a setting time T6 determined in advance, outputs the overcurrent detection signal S2 to both the control circuit 80 and to the alarm generation circuit 100.

When a high level signal is output from the comparator 1201, the timer latch 1203 counts the time duration of the output signal, and when the counted time becomes equal to or greater than a setting time T5 determined in advance, outputs the surge suppression detection signal S3 to the control circuit 80.

Here, the setting time T5 of the timer latch 1203 is set to be short compared with the setting time T6 of the timer latch 1202.

When the pass-through current detection signal S1 is output from the pass-through current detection circuit 30, the control circuit 80A outputs a driving signal S11 which turns off the switching device Q1 to the transistor 94. As a result the driving signal S11 turns on the transistor for soft shutoff 94, the gate of the switching device Q1 is connected to ground, and the gate charge is gradually discharged.

When only the surge suppression detection signal S3 is output from the current detection circuit 120, the control circuit 80A outputs the driving signal S12 to turn off the switching device Q1 to the transistor 95 based on the surge suppression detection signal S3. As a result the driving signal S12 turns on the transistor for soft shutoff 95, the gate of the switching device Q1 is connected to ground, and the gate charge is gradually discharged.

Further, when the surge suppression detection signal S3 and overcurrent detection signal S2 are output from the current detection circuit 120, the control circuit 80A outputs the driving signal S11 to turn off the switching device Q1 to the transistor 94 based on both these signals S2 and S3. As a result, the driving signal S11 turns on the transistor for soft shutoff 95, the gate of the switching device Q1 is connected to ground, and the gate charge is gradually discharged.

When the pass-through current detection signal S1 is output from the pass-through current detection circuit, the overcurrent detection signal S2 is output from the current detection circuit 120, or the overheating detection signal S4 is output from the overheating detection circuit 60, the alarm generation circuit 100A generates an alarm signal and outputs the alarm signal to the alarm transmission circuit 110. When an alarm signal is generated and output, the alarm generation circuit 100A notifies the control circuit 80A of this fact.

(Operation of the Second Embodiment)

Next, operation of this second embodiment is explained referring to the drawings.

(First Operation Example)

Figure 5:
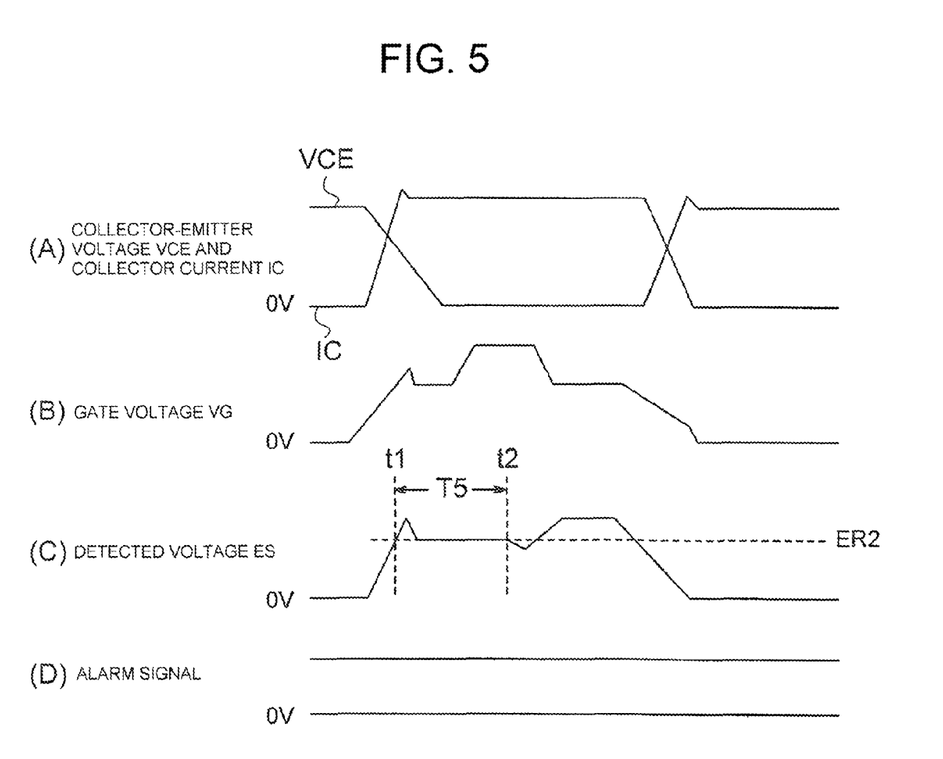
FIG. 5 is a waveform diagram of various portions, explaining a first operation example of the second embodiment.

A first operation example is explained referring to FIG. 4 and FIG. 5.

Based on an input signal IN input to the input terminal 1, the control circuit 80A generates and outputs the driving signals S7 and S8. By this means, when the driving signal S7 is output from the control circuit 80A, the transistor 91 operates as a result, and the switching device Q1 is turned on. And when the driving signal S8 is output from the control circuit 80A, the transistor 92 operates as a result, and the switching device Q1 is turned off.

By means of this operation, before or at time t1 shown in FIG. 5, the gate voltage VG of the switching device Q1 is as shown in (B) of FIG. 5. Further, the collector-emitter voltage VCE of the switching device Q1 and the collector current IC of the MOS transistor Q1 are as shown in (A) of FIG. 5. Further, the detected voltage ES output from the current sensor 10 is as shown in (C) of FIG. 5.

And as shown in (C) of FIG. 5, when at time t1 the detected voltage ES of the current sensor 10 becomes equal to or greater than the reference voltage ER2 of the comparator 1201, the comparator 1201 outputs a high level signal to both the timer latches 1202 and 1203.

The timer latch 1203 counts the time duration of the output signal from the comparator 1201, and when at time t2 the counted time becomes equal to or greater than the setting time T5, the surge suppression detection signal S3 is output to the control circuit 80A.

On the other hand, the timer latch 1202 counts the time duration of the output signal from the comparator 1201. However, after time t2 has passed, the detected voltage ES of the current sensor 10 temporarily falls below the reference voltage ER2 of the comparator 1201, and so the output of the high level voltage from the comparator 1201 stops.

Due to this stoppage, the timer latch 1202 is reset, the time duration of the output signal from the comparator 1201 does not become equal to or greater than the setting time T6, and the overcurrent detection signal S2 is not output from the timer latch 1202. Hence the overcurrent detection signal S2 is not output from the timer latch 1202 to the alarm generation circuit 100A, and thus an alarm signal is not output from the alarm output circuit 110 (see (D) of FIG. 5).

In this way, when only the surge suppression detection signal S3 is output from the timer latch 1203 to the control circuit 80A, the control circuit 80A generates the driving signal S12 based on this surge suppression detection signal S3 and outputs this driving signal S12 to the transistor 95. As a result the transistor 95 is turned on, the gate of the switching device Q1 is connected to ground, and the gate charge is gradually discharged. Hence when, although there is no overcurrent, it is necessary to suppress surge voltages during current shutoff of the switching device Q1, this suppression can be performed.

(Second Operation Example)

Figure 6:
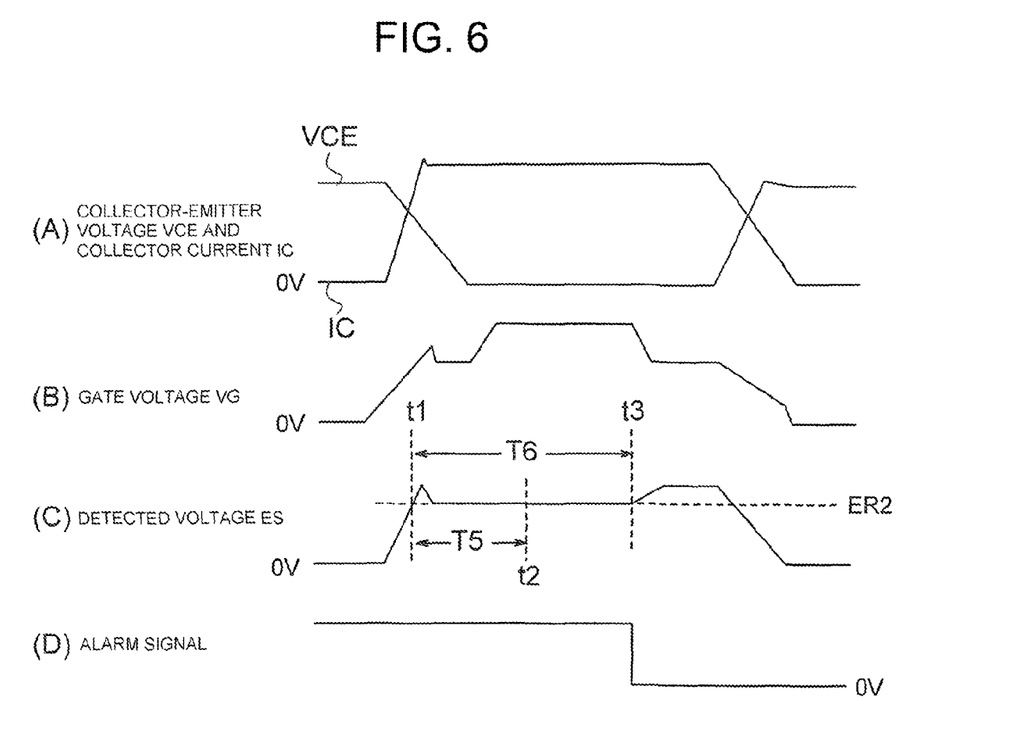
FIG. 6 is a waveform diagram of various portions, explaining a second operation example of the second embodiment.

A second operation example is explained referring to FIG. 4 and FIG. 6.

As shown in (C) of FIG. 6, when at time t1 the detected voltage ES of the current sensor 10 becomes equal to or greater than the reference voltage ER2 of the comparator 1201, the comparator 1201 outputs a high level signal to each of the timer latches 1202 and 1203.

The timer latch 1203 counts the time duration of the output signal from the comparator 1201, and when at time t2 the counted time becomes equal to or greater than the setting time T5, outputs the surge suppression detection signal S3 to the control circuit 80A.

On the other hand, the timer latch 1202 counts the time duration of the output signal from the comparator 1201, and when at time t3 the counted time becomes equal to or greater than the setting time T6, the overcurrent detection signal S2 is output to the control circuit 80A.

In this way, when the surge suppression detection signal S3 and the overcurrent detection signal S2 are output to the control circuit 80A from the timer latches 1203 and 1202 respectively, the control circuit 80A generates the driving signal S11 on the basis of the two signals S2 and S3, and outputs this driving signal S11 to the transistor 94. By this means, the transistor 94 is turned on, the gate of the switching device Q1 is connected to ground, and the gate charge is gradually discharged. Consequently, surge voltages due to overcurrents during current shutoff of the switching device Q1 are suppressed.

(Advantageous Effects of the Second Embodiment)

As explained above, by means of the second embodiment, when the switching device Q1 is not in an overcurrent state, but suppression of surge voltages at the time of current shutoff of the switching device Q1 is necessary for the purpose of protection from overcurrents, such surge voltages can be effectively suppressed, as in the first operation example.

Further, as described above, in the first embodiment the shutoff capability of the transistor 95 for soft shutoff of the switching device Q1 is made larger than the shutoff capability of the transistor 94.

Hence in order to protect from overcurrents, changes in the collector-emitter voltage VCE and the collector current IC of the switching device Q1 during soft shutoff of the switching device Q1 by the transistor 94 are as shown in (A) of FIG. 6. On the other hand, in order to suppress surge voltages, the changes in the collector-emitter voltage VCE and the collector current IC of the switching device Q1 when the transistor 95 performs soft shutoff of the switching device Q1 are as shown in (A) of FIG. 5, and the slopes of these changes are large compared with (A) of FIG. 6.

Hence by means of the second embodiment, when the transistor 95 performs soft shutoff of the switching device Q1, the power consumption during shutoff can be reduced compared with a case in which the transistor 94 performs soft shutoff of the switching device Q1.

It will be appreciated by those skilled in the art that the invention may be practiced otherwise than as expressly disclosed herein, and that substitutions and variations may be made without departing from the scope of the invention.

What is claimed is:

1. A control apparatus which controls conduction and shutoff of a switching device having an overcurrent threshold, the control apparatus comprising:

a current sensor which detects a current flowing in the switching device and generates a detected current signal representative of the current;

a first comparison circuit which compares the detected current signal with a predetermined first reference value, and when the detected current signal is equal to or greater than the first reference value, outputs a surge suppression signal; and a first shutoff circuit which grounds a control terminal of the switching device in response to output of the surge suppression signal from the first comparison circuit, wherein the first reference value is smaller than a predetermined second reference value, the second reference value representing a value of the detected current signal corresponding to the overcurrent threshold, and wherein the first reference value is set to represent a value of the detected current signal between a rated current value of the switching device and the overcurrent threshold.

2. The control apparatus for a switching device according to claim 1, further comprising:

a second comparison circuit which compares the detected current signal with the second reference value, and when the detected current signal is equal to or greater than the second reference value, outputs an overcurrent detection signal; and a second shutoff circuit which shuts off the switching device when both the surge suppression signal is output from the first comparison circuit and the overcurrent detection signal is output from the second comparison circuit.

3. The control apparatus for a switching device according to claim 2, wherein, when the first and second shutoff circuits are respectively activated, the first shutoff circuit reduces the current flowing in the switching device more rapidly than does the second shutoff circuit.

4. The control apparatus for a switching device according to claim 2, wherein the first shutoff circuit includes a first transistor which is turned on by a first driving signal generated based on the surge suppression signal, and which thus draws charge from the control terminal of the switching device, the second shutoff circuit includes a second transistor which is turned on by a second driving signal generated based on the surge suppression signal and the overcurrent detection signal, and which thus draws charge from the control terminal of the switching device, and a current driving capability of the first transistor is set to be greater than a current driving capability of the second transistor.

5. The control apparatus for a switching device according to claim 2, further comprising an alarm generation circuit which generates an alarm signal when the overcurrent detection signal is output from the second comparison circuit.

6. A control apparatus for a switching device, which controls conduction and shutoff of the switching device, comprising:

a current sensor which detects a current flowing in the switching device and generates a detected current signal representative of the current;

a comparison circuit which compares the detected current signal with a predetermined reference, and when the detected current signal is equal to or greater than the reference value, outputs a detection signal;

a first signal generation circuit which outputs a surge suppression signal when a time duration of the detection signal output from the comparison circuit is equal to or greater than a predetermined first setting time; and a first shutoff circuit which shuts off the switching device in response to the output of the surge suppression signal from the first signal generation circuit, wherein the first setting time is set to be shorter than a predetermined second setting time that is a time threshold indicating an overcurrent flowing in the switching device.

7. The control apparatus for a switching device according to claim 6, further comprising:

a second signal generation circuit which outputs an overcurrent detection signal when the time duration of the detection signal output from the comparison circuit is equal to or greater than the second setting time; and a second shutoff circuit which shuts off the switching device in response to both output of the surge suppression signal from the first signal generation circuit, and output of the overcurrent detection signal from the second signal generation circuit.

8. The control apparatus for a switching device according to claim 7, further comprising an alarm generation circuit which generates an alarm signal when the overcurrent detection signal is output from the second signal generation circuit.

9. The control apparatus for a switching device according to claim 7, wherein, when respectively activated, the first shutoff circuit reduces the current flowing in the switching device more rapidly than the second shutoff circuit.

10. The control apparatus for a switching device according to claim 7, wherein the first shutoff circuit includes a first transistor which is turned on by a first driving signal generated based on the surge suppression signal, and which thus draws charge from a gate terminal of the switching device, the second shutoff circuit includes a second transistor which is turned on by a second driving signal generated based on the surge suppression signal and the overcurrent detection signal, and which thus draws charge from the gate terminal of the switching device, and a current driving capability of the first transistor is set to be greater than a current driving capability of the second transistor.

11. A method of controlling conduction and shutoff of a switching device having an overcurrent threshold, the method comprising the steps of:

detecting a current flowing in the switching device and generating a detected current signal representative of the current;

comparing the detected current signal with a predetermined first reference value, and when the detected current signal is equal to or greater than the first reference value, generating a detection signal;

setting the first reference value to be smaller than a predetermined second reference value which represents a value of the detected current signal corresponding to the overcurrent threshold;

grounding a control terminal of the switching device responsive to the detection signal; and setting the first reference value to represent a value of the detected current signal between a rated current value of the switching device and the overcurrent threshold.

12. The method according to claim 11, further comprising the steps of:

comparing the detected current signal with the second reference value, and when the detected current signal is equal to or greater than the second reference value, generating an overcurrent detection signal; and shutting off the switching device responsive to the surge suppression signal and the overcurrent detection signal.

13. The method according to claim 12 further comprising outputting an alarm signal when the overcurrent detection signal is generated.

14. A method of controlling conduction and shutoff of a switching device having an overcurrent threshold, the method comprising the steps of:

detecting a current flowing in the switching device and generating a detected current signal representative of the current;

comparing the detected current signal with a predetermined first reference value, and when the detected current signal is equal to or greater than the first reference value, generating a detection signal;

setting the first reference value to be smaller than a predetermined second reference value which represents a value of the detected current signal corresponding to the overcurrent threshold;

shutting off the switching device responsive to the detection signal;

generating a surge suppression signal in response to the detection signal when a time duration of the detection signal output from the comparison circuit is equal to or greater than a predetermined first setting time;

setting the first setting time to be shorter than a predetermined second setting time which is a time threshold indicating an overcurrent flowing in the switching device; and shutting off the switching device when the surge suppression signal is generated.

15. The method according to claim 14, further comprising:

generating an overcurrent detection signal when the time duration of the detection signal is equal to or greater than the second setting time; and shutting off the switching device responsive to both the surge suppression signal and the overcurrent detection signal.

* * * * *